(12) United States Patent
Ognibene et al.

(10) Patent No.: US 6,634,421 B2
(45) Date of Patent: Oct. 21, 2003

(54) HIGH PERFORMANCE COLD PLATE FOR ELECTRONIC COOLING

(75) Inventors: Edward J. Ognibene, Belmont, MA (US); Evgeny N. Holmansky, Acton, MA (US); Douglas L. Johnson, Georgetown, MA (US); Kevin J. Donegan, Saratoga Springs, NY (US)

(73) Assignee: SatCon Technology Corporation, Cambridge, MA (US)

( * ) Notice: Subject to any disclaimer, the term of this patent is extended or adjusted under 35 U.S.C. 154(b) by 8 days.

(21) Appl. No.: 09/803,562

(22) Filed: Mar. 9, 2001

(65) Prior Publication Data

US 2001/0035285 A1 Nov. 1, 2001

Related U.S. Application Data

(60) Provisional application No. 60/188,386, filed on Mar. 10, 2000.

(51) Int. Cl.[7] ............... F28F 3/00; F28F 7/02; F28F 3/08
(52) U.S. Cl. ............ 165/166; 165/164; 165/167
(58) Field of Search ................ 165/164, 165, 165/166, 167, 80.4; 29/890.039

(56) References Cited

U.S. PATENT DOCUMENTS

| 2,656,159 A | 10/1953 | Holm et al. ............... 257/245 |
| 3,404,446 A | 10/1968 | Kritzer ..................... 29/157.3 |
| 4,593,446 A | * 6/1986 | Hayner ..................... 29/157 R |
| 4,624,305 A | 11/1986 | Rojey ....................... 165/165 |
| 4,807,342 A | 2/1989 | Lapeyre ................... 29/157.3 |

(List continued on next page.)

FOREIGN PATENT DOCUMENTS

| CA | 1 026 013 | 2/1978 | ................ 356/113 |
| DE | 25 31 450 | 1/1977 | ........... H01L/23/36 |
| GB | 604464 | 7/1948 | |
| GB | 1 334 173 | 10/1973 | ............ H01L/1/12 |
| GB | 2 270 862 | 3/1994 | ............ B21D/53/02 |
| JP | 4-234153 | 8/1992 | ........... H01L/23/36 |
| JP | 6-074675 | 3/1994 | ............. F28F/3/00 |
| SU | 1161810 A | 6/1985 | |

OTHER PUBLICATIONS

Biskeborn R. G., et al., "Cooling Fin Structure"; IBM Technical Disclosure Bulletin; vol. 25, No. 2, p. 618, Jul. 1982.

Primary Examiner—Henry Bennett
Assistant Examiner—Tho V Duong
(74) Attorney, Agent, or Firm—George W. Hartnell, III; Edwards & Angell, LLP

(57) ABSTRACT

A fluid cooling device, and a method for manufacturing the fluid cooling device, are disclosed. The fluid cooling device includes a plurality of cold plate members, each having a plurality of imperforate plate portions and perforate portions arranged in a line; and, at least one connector for connecting the plate portions together at one end thereof. The cold plate members are arranged in a stack, wherein respective plate portions of each cold plate member are in registration with perforate portions formed in its adjacent cold plate members in the stack. The fluid cooling device can provide very high heat transfer by close clearance laminar developing flow, thereby increasing the thermal performance of the fluid cooling device while maintaining low pressure drop. The method for manufacturing the fluid cooling device includes forming a plurality of cold plate members from a planar metal tape, or thin layer stock; positioning the cold plate members relative to each other so that the respective imperforate plate portions of each cold plate member are in registration with the perforate portions formed in adjacent cold plate members; and joining each cold plate member with the adjacent cold plate members.

24 Claims, 4 Drawing Sheets

U.S. PATENT DOCUMENTS

| | | | |
|---|---|---|---|
| 5,021,924 A | 6/1991 | Kieda et al. | 361/385 |
| 5,058,665 A * | 10/1991 | Harada | 165/166 |
| 5,193,611 A | 3/1993 | Hesselgreaves | 165/165 |
| 5,212,004 A * | 5/1993 | Bottcher et al. | 165/166 |
| 5,369,301 A | 11/1994 | Hayashi et al. | 257/722 |
| 5,381,859 A * | 1/1995 | Minakami et al. | 165/80.3 |
| 5,419,041 A | 5/1995 | Ozeki | 29/890.03 |
| 5,421,406 A | 6/1995 | Furusawa et al. | 165/185 |
| 5,423,376 A | 6/1995 | Julien et al. | 165/80.4 |
| 5,447,189 A | 9/1995 | McIntyre | 165/1 |
| 5,930,115 A | 7/1999 | Tracy et al. | 361/704 |
| 6,014,312 A | 1/2000 | Schulz-Harder et al. | 361/699 |
| 6,273,186 B1 * | 8/2001 | Ognibene et al. | 165/185 |

* cited by examiner

HIGH PERFORMANCE COLD PLATE FOR ELECTRONIC COOLING

REFERENCE TO RELATED APPLICATIONS

The present application claims a right of priority to provisional application No. 60/188,386 entitled "High Performance Cold Plate for Electronic Cooling" filed Mar. 10, 2000.

BACKGROUND OF THE INVENTION

1. Field of the Invention

This invention relates generally to fluid cooling devices, and more particularly to fluid cooling devices including pluralities of superimposed cold plates for use in removing heat generated in systems, e.g., electronic systems and electronic components, and methods of manufacturing such fluid cooling devices.

2. Background

Fluid cooling devices including one or more high heat flux cold plates have been used for removing or transferring heat generated in, e.g., electronic components and/or systems during operation. Traditionally, such fluid cooling devices have been designed for providing turbulent flows of fluid near a single cold plate and/or between a plurality of parallel cold plates. This is because turbulent fluid flows generally have thinner boundary layers and more fluid mixing than laminar flows and, consequently, higher heat transfer coefficients for fully developed flow.

However, cold plates for use with turbulent fluid flows have drawbacks. For example, as the turbulence and Reynolds number, Re, of a cooling fluid increase, more pressure is generally required to pass a given volume of the fluid through the cooling device. As a result, fluid pressure drop in the direction of fluid flow increases with the square of the volumetric flow rate. In contrast, for laminar fluid flows, the fluid pressure drop in the direction of fluid flow is linearly proportional to the volumetric flow rate.

An example of a fluid cooling device including a plurality of superposed plates is disclosed in GB Patent 604, 464 ("the '464 patent") to Girodin. In accordance with that disclosure, a heat exchange device includes the plurality of superposed plates, each plate having parallel rows of perforations between which there are parallel imperforate strips. The plates are closely applied together so that each imperforate strip of each plate is in contact with an imperforate strip of the immediately adjacent plates. Further, the rows of perforations of a plate are staggered in relation to the rows of perforations of the immediately adjacent plates. In order to provide flow paths for the exchanging fluids, the paths are parallel to the imperforate strips, which form partitions between the exchanging fluids.

Another example of a fluid cooling device including a plurality of plates is disclosed in Russian Patent SU 1,161, 810 ("the '810 patent"). In accordance with that disclosure, a heat exchanger packet includes perforated plates whose perforations are displaced in adjacent plates and are joined into groups limited by frames forming channels for working media. Heat transfer is intensified and the heat exchanger is made more compact because the perforations in each channel have equivalent diameter equal to the width of the channel and are placed with a step whose length is 1.25 to 2 times the channel width. Further, the distance between the perforation centers in adjacent plates is 0.25 to 0.5 times their distance in the channel; and the plate sections between adjacent perforations in each group are bent by an angle of 1 to 6 degrees to the plate plane.

However, the conventional fluid cooling devices described in the '464 and '810 patents also have drawbacks. For example, typically, they cannot provide the high level of thermal performance required in today's highly integrated and/or power dense electronic components and systems at an acceptable pressure drop and cost. This is because neither the '464 nor the '810 patent is concerned with how the fluid cooling device disclosed therein might be optimized for providing the highest level of thermal performance for a given type of cooling fluid flow.

For example, the disclosure given in the '464 patent of various embodiments of fluid cooling devices has in view heat exchangers with either streamline (i.e., laminar) or turbulent fluid flow. Further, the '810 patent teaches that heat transfer is intensified using the fluid cooling device disclosed therein through multiple movement direction variation, which is understood to refer to turbulent fluid flow. But, neither the '464 nor the '810 patent shows how the fluid cooling device disclosed therein might be optimized for providing the highest level of thermal performance in either the laminar or turbulent flow regime, subject to pressure drop and cost constraints. Although turbulent fluid flows normally enhance the efficiency of the heat transfer, e.g., from the cold plates to the cooling fluid, particularly in the case of fully developed flows, and although the fluid cooling devices of the '464 and '810 patents may be used with such turbulent fluid flows, neither the '464 nor the '810 patent discloses how to deal with the pressure drop and the reduced heat transfer efficiency resulting therefrom as the turbulence of the cooling fluid increases.

U.S. Pat. No. 4,807,342 describes a heat exchanger for indirect exchange between two fluid media and a method for making the same that maximizes heat exchange between the two fluid media by providing a multitude of individual, tortuous flow channels though a thin walled device. U.S. Pat. No. 5,021,924 describes a semiconductor cooling device comprising a sealed structure in which the backs of integrated circuit chips are individually cooled with forced convection using a cooling liquid wherein greater heat transfer is obtained by increasing the velocity gradient and controlling the angle of impingement of the coolant when it strikes the back of the IC chips. Neither of these inventions addresses pressure drop and/or the advantages of laminar flow over turbulent flow in heat exchange.

Because of increased power dissipation needs of modern electronic packages, there is a continued need for new, more efficient and cost effective methods and cooling devices.

SUMMARY OF THE INVENTION

The present inventors have recognized that, although heat transfer in fluid cooling devices including a plurality of cold plates generally is more efficient with turbulent fluid flow, improved thermal performance can be achieved by configuring the fluid cooling devices to support laminar fluid flow, particularly, when the flow boundary layer is developing. Significantly, it has been discovered that fluid cooling devices configured for use with laminar fluid flows can provide improved thermal performance without the high pressure drop that often results in conventional fluid cooling devices that utilize turbulent flow regimes.

In accord with the present invention, contrary to conventional practice, a fluid cooling device is configured for use preferably with laminar, particularly developing laminar fluid flows, thereby providing both high thermal performance and low pressure drop. The present invention also provides a simple and lower cost method of manufacturing such fluid cooling devices.

Thus, the present invention provides a fluid cooling device comprising a plurality of superimposed cold plates having an alternating, or staggered, pattern for forming alternate parallel paths of fluid flow. Preferably, the fluid cooling device of the present invention is structured and arranged to utilize laminar, developing fluid flows, thereby delivering high thermal performance with low pressure drop. The present invention also provides a simplified, flexible process for manufacturing the fluid cooling device that is not only relatively inexpensive to implement, but can also be used to design and configure fluid cooling devices suitable for use with a wide range of systems and components having a wide range of performance and cost requirements.

According to one embodiment of the present invention, a fluid cooling device includes a plurality of cold plate members or stack of cold plate members, each cold plate member or stack of cold plate members including at least one plate portion and at least one perforate portion, wherein the plurality of cold plate members or stack of cold plate members is disposed causing the plate portion of each cold plate member to be in registration with respective perforate portions of adjacent cold plate members in the stack, and wherein the length of the plate portion of each cold plate member is less than the length of the perforate portion in a direction parallel to a fluid flow, the length of the plate portion of each cold plate member being set so that boundary layers growing near opposing surfaces of adjacent plate portions in the stack do not merge during flow along the entire length of the opposing surfaces, thereby providing laminar flow over the entire length of those surfaces.

Preferably, before the boundary layers have a chance to merge, i.e., fully develop, the structure of the fluid cooling device breaks, or interrupts, the flow and re-starts the boundary layer growth process. The dimensions of the structure are designed by well known heat conduction and fluid flow relationships according to the properties of the cooling fluid used. The fluid cooling device then operates continuously in, preferably, the laminar, developing or entry region flow regime. Advantageously, the performance in the laminar, developing, or entrance region can far exceed that of fully developed laminar flow, and in many cases turbulent flow as well.

The above-described embodiment of the fluid cooling device can significantly improve heat transfer via convection from the fluid cooling device to a coolant flowing over and through the fluid cooling device, while reducing pressure drop in the direction of fluid flow, in comparison with thermally comparable prior art turbulent flow cooling device designs.

According to another embodiment of the present invention, a method of manufacturing a fluid cooling device includes the steps of (i) forming a plurality of identical cold plate members; (ii) positioning the plurality of cold plate members relative to each other by alternating the cold plate members (or stack of cold plate members) so that each cold plate member is the reverse, "mirror image" of any adjacent cold plate members (or stack of cold plate members) and, moreover, so that respective plate portions of each cold plate member are in registration with perforate portions formed in adjacent cold plate members and the dimensions of fluid paths are such that the fluid is substantially continuously, preferably, in laminar flow; and (iii) joining each cold plate member with its adjacent cold plate members, thereby forming the fluid cooling device.

The above-described embodiment of the method of manufacturing a fluid cooling device is relatively simple and inexpensive to implement, thereby allowing the manufacture of relatively low-cost fluid cooling devices for accommodating a wide range of designs and performance requirements. Still further aspects and advantages of the present invention will become apparent from a consideration of the ensuing description and drawings. Through design this technology allows for easy tailoring of cold plates for specific fluids and flow rates.

BRIEF DESCRIPTION OF THE DRAWINGS

The invention will be better understood by reference to the following more detailed description and accompanying drawings in which.

DETAILED DESCRIPTION OF THE INVENTION INCLUDING PREFERRED EMBODIMENTS THEREOF

Figure 1:
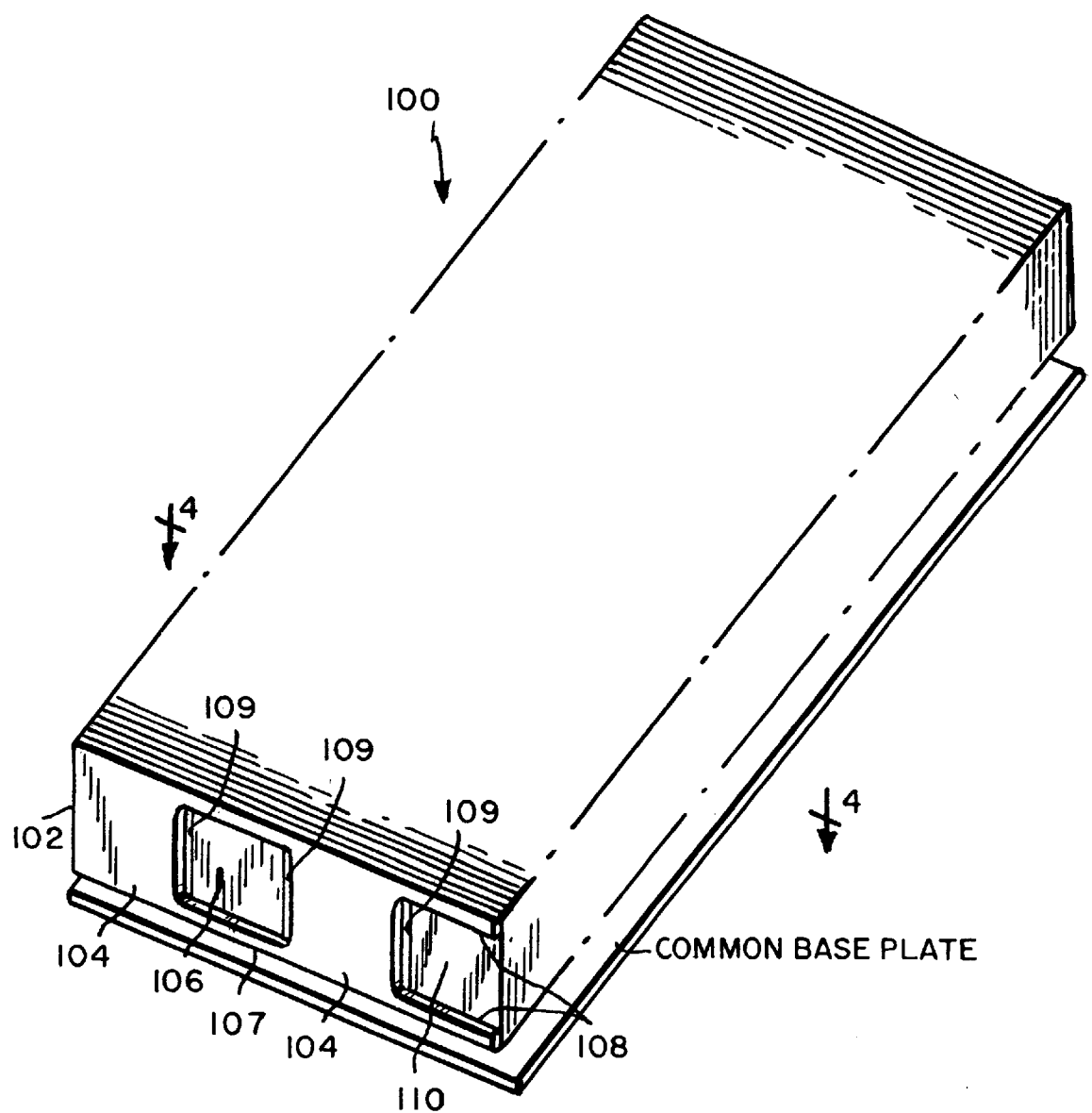
FIG. 1 is a perspective view of an embodiment of a fluid cooling device including a plurality of superimposed cold plates, in accordance with the present invention.

FIG. 1 shows a perspective view of an illustrative embodiment of a fluid cooling device 100 in accordance with the present invention. The fluid cooling device 100 includes a plurality of cold plate members 102. Furthermore, in the illustrative embodiment shown, each cold plate member 102 includes at least one, but preferably a plurality of imperforate plate portions 104, at least one perforate portion 106, and a pair of imperforate strips 107 for connecting the plate portions 104 together, each at opposing ends thereof.

Preferably, each plate portion 104 is substantially smooth and flat with a substantially square or rectangular shape. Furthermore, as shown in FIG. 1, the plurality of plate portions 104 preferably is arranged in a line between the imperforate strips 107 at regularly spaced intervals, thereby defining a bounded perforate portion 106—which will be referred to throughout the remainder of this disclosure as simply a "perforate portion 106"—which also has a substantially square or rectangular shape. In addition, the imperforate strips 107 of each cold plate member 102 preferably include respective projecting portions 108 at one end of the cold plate member 102, the projecting portion preferably having a length approximately equal to the width of the perforate portion 106 and providing another unbounded perforate portion 110—which will be referred to throughout the remainder of this disclosure as an "unbounded perforate portion 108"—that is open at one end.

Figure 4:
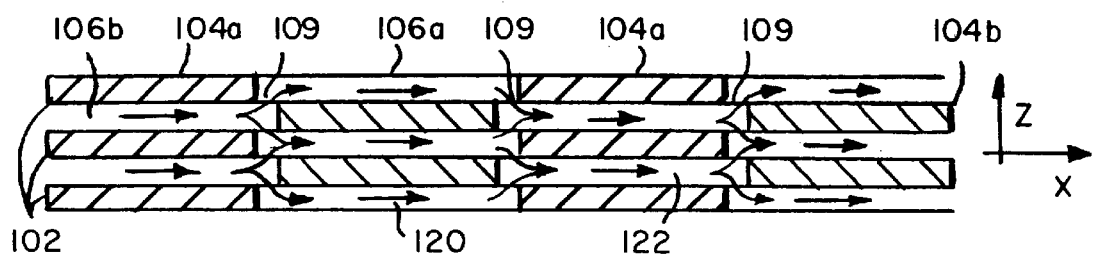
FIG. 4 is a partial cross-sectional view of and embodiment of the fluid cooling device shown in FIG. 1 taken along the line 4—4, for showing alternate parallel paths of fluid flow.

Although only a single perforate portion 106 is shown in the illustrative example, having more than one perforate portion 106 on the plurality of cold plate members 102 forming a fluid cooling device 100 can be desirable. Indeed, the greater the number of perforate portions 106, the shorter the length of the plate portion 104 and the shorter the flow paths 120 and 122 (See FIG. 4). As these lengths are minimized, pressure drops can be reduced and laminar flow conditions can be ensured.

Adjacent cold plate members 102 of the fluid cooling device 100 can be held in contact by any suitable manner. For example, the adjacent cold plate members 102 can be joined at the face portions of the respective strips 107 either with a suitable adhesive or by soldering, brazing, pinning, riveting or even held in contact mechanically, e.g., by using a pressure clamping device. Alternatively, the adjacent cold plate members 102a and 102b (FIG. 2) can be joined to at least one common base plate in a similar manner. Preferably, adjacent pairs 102a and 102b of the cold plate members 102 of the fluid cooling device 100 are held in contact such that respective projecting portions 108 of the adjacent pairs 102a and 102b are at opposing sides, or ends, of the fluid cooling device 100.

As a result, the adjacent pairs 102a and 102b of the cold plate members 102 are superimposed, whereby a plate portion 104 at one end of a first cold plate member 102a is opposite projecting portions 108b of a second cold plate member 102b, and the remaining plate portion 104 of the first cold plate member 102a is in registration with the perforate portion 106 of the second cold plate member 102b. In effect, respective plate portions 104 of adjacent cold plate members 102a and 102b are staggered, ie., the respective plate portions 104 of the adjacent cold plate members 102a and 102b form an alternating pattern, which provides alternate parallel paths, or channels, of flow (see, e.g., flow paths 120 and 122 shown in FIG. 4) through the fluid cooling device 100 for a cooling fluid. However, the ends of the adjacent cold plate members 102 are in registration (See FIG. 1).

Preferably, in order to ensure that the alternate parallel paths, or channels of flow, e.g., the flow paths 120 and 122, are in fluid communication with each other, the width of respective perforate portions 106 in cold plate members 102, as measured in the direction of fluid flow (as indicated by arrows shown in FIG. 4), must be greater than the width of the respective plate portions 104, which lays either in registration with corresponding perforate portions 106 of adjacent cold plate members 102 or opposite corresponding projecting portions 108. As a result, the imperforate plate portions 104 and narrow perforations 109 (see FIGS. 1, 4, and 5) are disposed alternately in the direction of fluid flow. Accordingly, when the adjacent pairs of the cold plate members 102a and 102b are superimposed, each flow path are in fluid communication with adjacent flow path(s) parallel thereto, via the narrow perforations 109.

An important advantage of the illustrative embodiment of FIG. 1 is that the staggered plate portions 104 of the fluid cooling device 100 improve heat transfer from the fluid cooling device 100 to the coolant flowing through the fluid cooling device 100 via forced convection, specifically through developing flow and more preferably through close clearance, laminar developing flow. For example, the coolant flow can be provided as a forced flow or natural convection of any fluid such as air, gas, vapor, liquid, oil, water ethylglycol (WEG) or any mixture thereof.

The fluid cooling device 100 is normally thermally engaged, i.e., typically in intimate contact, with one or more electronic components (not shown) of an electronic system (not shown) in any conventional manner. It should therefore be understood that the manner in which the fluid cooling device 100 engages an electronic component(s) and/or system is not critical to the present invention, and can be accomplished in various conventional ways.

In the illustrative embodiment, once the fluid cooling device 100 is suitably thermally engaged, i.e., in intimate contact, with the electronic component(s) and/or system, heat generated in the electronic component(s) and/or system during operation are transferred first to the fluid cooling device 100 via conduction through the plate portions 104, and then transferred to the coolant flowing there through via forced convection. Accordingly, in this illustrative embodiment, the manner in which the fluid cooling device 100 thermally engages the electronic component(s) preferably optimizes the conductive transfer of heat from the electronic component(s) to the fluid cooling device 100. Furthermore, the increased flexibility of the manufacturing process of the present invention, as described below, allows design and optimization of fluid cooling devices 100 that satisfies the specific performance and cost requirements of this illustrative embodiment.

Moreover, the staggered, or alternating, reverse "mirror image" plates 104 of the fluid cooling device 100 improve the transfer of heat via forced convection from the fluid cooling device 100 to the coolant by way of, e.g., close clearance, laminar, developing flow. For example, FIG. 5 shows a detailed portion of the cross-sectional view of the fluid cooling device 100 shown in FIG. 4, including the plurality of plate portions 104 and the narrow perforations 109 that form the alternate parallel paths of fluid flow.

Figure 5:
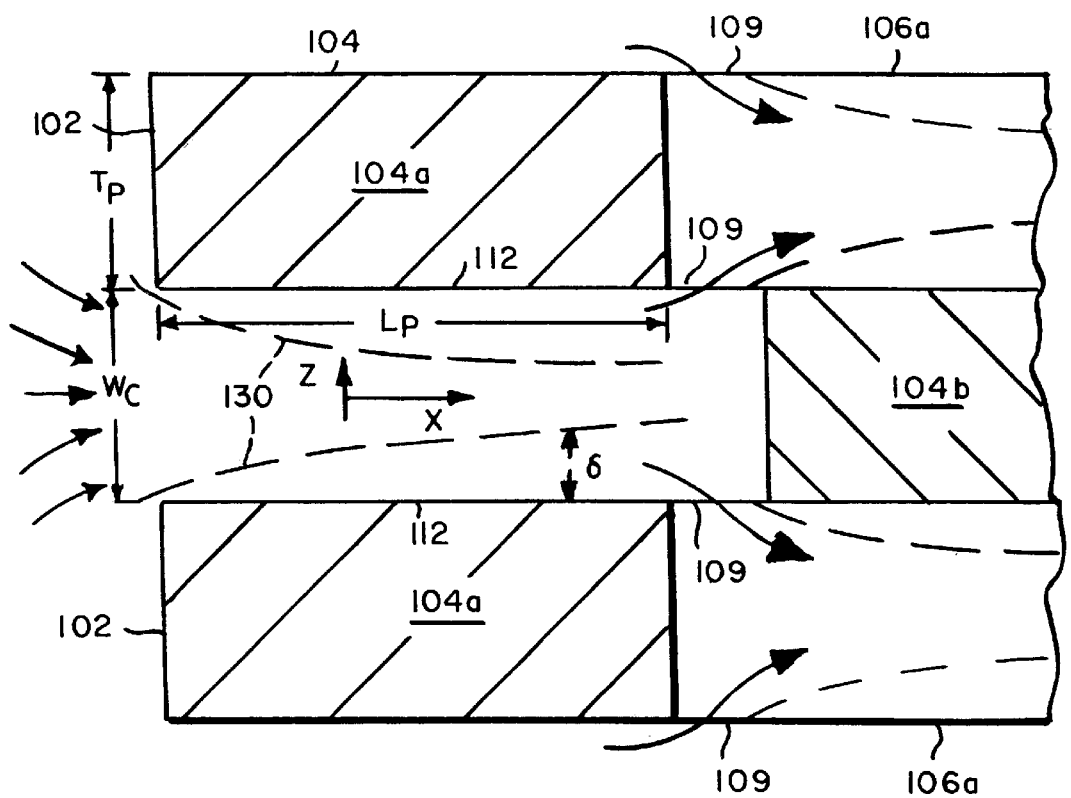
FIG. 5 is a detailed view of and embodiment of the alternate parallel paths of fluid flow shown in FIG. 4, for showing the development of boundary layers near surfaces of the cold plates.

FIG. 5 shows a preferred direction of fluid flow (as indicated by the arrows) and growing boundary layers 130. Boundary layers 130 typically occur near surfaces of the plate portions 104 as a result of fluid flow. In a preferred embodiment of the present invention, the fluid cooling device 100 is optimized by ensuring that boundary layers 130 growing at or near opposing surfaces of plate portions 112 in each alternate parallel path of flow 120 and 122 do not merge. Thus, preferably, close clearance, laminar, developing flow through the alternate parallel paths is produced, which can increase heat transfer with minimal pressure loss. Advantageously, the heat transferred through such close clearance, laminar, developing flow in the illustrative embodiment of the fluid cooling device 100, as shown in FIG. 5, exceeds the heat transferred through turbulent, fully developed, fluid flow. Moreover, the heat transferred through such close clearance, laminar, developing flow occurs with significantly less pressure drop than with turbulent, fully developed, fluid flow.

As mentioned above, the fluid cooling device 100 preferably is configured to ensure that boundary layers 130 growing at or near the opposing surfaces of near adjacent plate portions 112 in each alternate parallel path of flow 120 and 122 do not merge. This means that the length, $L_p$ (see FIG. 5), of the opposing surfaces of adjacent plate portions 112 along the x-axis must be less than the theoretical entrance length, $L_e$, thereby never permitting the flow to become fully developed. The theoretical entrance length, $L_e$, is the distance from the entrance point (not numbered) to the point at which the fluid laminar flow boundary converges and starts fluid exchanges between the boundary layers of the opposing surfaces, i.e., substantially from the entrance, to a point (not shown) at which the viscous boundary layers 130 would theoretically merge. Accordingly, the optimized fluid cooling device 100 of the present invention preferably has a plate length, $L_p$, that is less than the theoretical entrance length, $L_e$; i.e., $L_p < L_e$.

Preferably, as the inviscid core of the cooling fluid converges and starts flowing between the opposing surfaces of the adjacent plate portions 104, the magnitude of the velocity of fluid flow near the opposing surfaces in the direction of the x-axis gradually decreases, thereby causing a viscous boundary layers 130 to grow downstream from the entrance region. If the plate length, $L_p$, were greater than or equal to the theoretical entrance length, $L_e$, i.e., $L_p \geq L_e$, then the boundary layers 130 would continue to grow and the magnitude of the fluid velocity at the centerline would continue to substantially decrease until the flow was fully viscous. Moreover, the boundary layers 130 would merge and fluid flow would become entirely viscous. With multiple perforate portions 106, flow can stay laminar more easily.

Further, at a distance $x=L_e$ from the conduit entrance, the magnitude of the fluid velocity in the center of the channel no longer decreases and fluid flow becomes fully developed. Significantly, if the plate length, $L_p$, is greater than or equal to the theoretical entrance length, $L_e$, i.e., $L_p \geq L_e$, then at distances $x>L_e$ from the entrance region, the magnitude of the fluid velocity is substantially constant and pressure drops linearly with x, whether the flow becomes laminar or turbulent.

Figure 6:
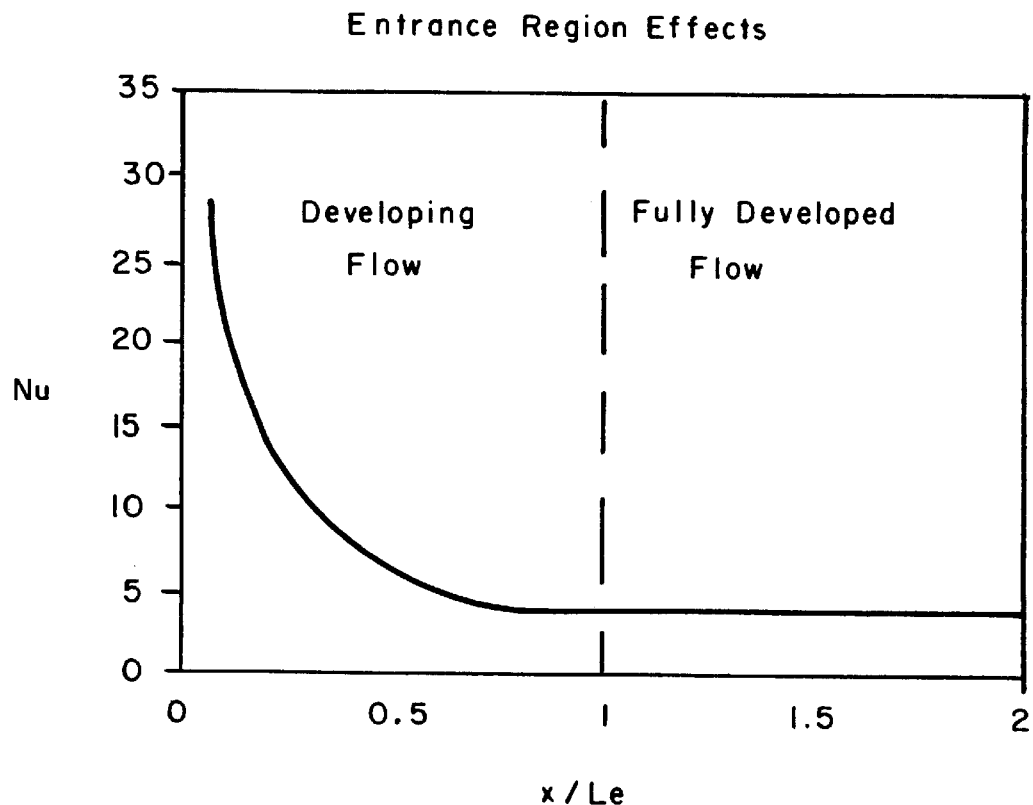
FIG. 6 shows the approximate location of the developing and fully developed regions in terms of the Nusselt number and a normalized distance.

This entrance region effect is illustrated in FIG. 6, which shows the dependence of the Nusselt number (Nu) on entry effects in internal, i.e., closed channel, flows. Heat transfer coefficient (h) is related to the Nusselt number as follows:

$$h=(k/d)Nu$$

in which k is the thermal conductivity of the fluid and d is the hydraulic diameter of the channel. Accordingly, it is advantageous to design convective cold plates that operate in or predominantly operate in a region where Nu is greatest, i.e., where $x/L_e$ is less than unity, which corresponds to the developing region (as shown in FIG. 6) or entrance region.

Indeed, developing flow in the entry region occurs when $x/L_e$ is less than unity. Furthermore, fully developed flow occurs when $x/L_e$ is greater than unity. When fluid first enters a channel, i.e., $x/L_e$ equals 0, there would be no boundary layer 130 at or near the opposing surfaces of the plate portions 112. Nu, and the heat transfer coefficient (h), therefore, would be at a theoretical maximum at the point of entry.

As flow continues in the x direction, i.e., $0<x<1$, boundary layers 130 begin to grow at or near the opposing surfaces of the plate portions 112 in accordance with physical laws that govern fluid flow. Nu and h continue to decrease as the boundary layers 130 grow. Indeed, Nu remains dependent on flow rate until the opposing boundary layers 130 meet.

Under normal conditions, the opposing boundary layers 130 continue to grow until they merge with one another about at the center of the channel. When the opposing boundary layers 130 first merge, i.e., $x/L_e=1$, flow becomes fully developed. At this point, Nu and h have reached a minimum and (for laminar flow) remain constant as $x/L_e$ exceeds 1. Given the dramatic decrease in Nu and h as a function of fluid flow and entrance level effects, fluid cooling devices 100 that operate or predominantly operate in the developing region can exhibit significantly higher thermal performance, i.e., transfer more heat per unit area, than fluid cooling devices 100 that operate in the fully developed region.

Furthermore, pressure drop in the fluid flow direction of the fluid cooling device 100 can be caused by the resistance of viscous shear stresses, $\tau_w$, on the opposing surfaces of the adjacent plate portions 104. Such resistance on the opposing surfaces also causes the pressure to drop linearly with x for laminar flow. For this reason, close clearance, laminar, developing flow of the coolant preferably is provided through the fluid cooling device 100 shown in FIG. 1, thereby further limiting the pressure drop in the direction of cooling fluid flow.

For example, the viscous shear stresses, $\tau_w$, on the opposing surfaces of the adjacent plate portions 112 of the fluid cooling device 100 are generally proportional to the rate of change of the thickness, $\delta$, of the boundary layers 130, i.e., in the developing region, $$\tau_w \propto (d\delta/dx).$$

Accordingly, one way of reducing the pressure drop in the fluid flow direction caused by the resistance of viscous shear stresses, $\tau_w$, on the opposing surfaces of the adjacent plate portions 104, is to reduce the magnitude of the shear stresses, $\tau_w$. This can be accomplished by ensuring that the boundary layers 130 near the surfaces of the plate portions 104 are relatively "thin."

For example, the thickness, $\delta$, of the boundary layers 130 near the surfaces of the plate portions 104 along the x-axis can be approximated by the following expression in the entrance region:

$$(\delta/x) \approx [5.0/(Re_x)^{1/2}],$$

wherein "$Re_x$" is the dimensionless Reynolds number of the coolant generally for external flow across a plate or, pertinent to the present invention, for the entrance region only of an internal flow conduit. Further, a boundary layer is generally considered "thin" if the ratio ($\delta/x$) is less than about 0.1. For example, this means that if the ratio ($\delta/x$) were equal to about 0.1, then the Reynolds number, $Re_x$, corresponding thereto would be equal to about 2500, which is generally characteristic of laminar fluid flow between parallel plates. Preferably, the Reynolds number, $Re_x$, remains less than the critical Reynolds number, $Re_{cr}$, which marks the onset of transition to turbulent flow. For square and rectangular conduits, this can be less than about 10,000, but closer to less than about 5000.

Accordingly, in order to further limit the pressure drop in the direction of cooling fluid flow, the resistance of viscous shear stresses, $\tau_w$, on the opposing surfaces of the adjacent plate portions 112 is minimized preferably by providing close clearance, laminar, developing flow of the coolant through the fluid cooling device 100. This means that the cooling fluid flow preferably is laminar, i.e., the corresponding Reynolds number, Re, corresponding to internal flow through a conduit, typically is less than the critical Reynolds number, $Re_{cr}$, which marks the onset transition to turbulent flow. The range of critical Reynolds numbers, $Re_{cr}$, typically is from about 5000 to about 10,000 for rectangular conduits depending on the aspect ratio of the channel and sharpness of the inlet; and, the boundary layers 130 near the opposing surfaces of the plate portions 112 are thin. The width, $w_c$, of channels formed between the opposing surfaces of the adjacent plate portions 104 of the preferred embodiment of the fluid cooling device 100 is therefore small but dependent on the nature of the coolant. As an illustrative example, the width, $w_c$, of channels using oil as a coolant can be about 0.75 mm.

It should be pointed out that although each plate portion 104 is substantially smooth, the degree of smoothness of the plate portions 104 is not critical to the invention. This is because the fluid cooling device 100 of the present invention preferably provides close clearance, laminar, developing flow of the coolant. The effect that surface roughness has on friction resistance is generally negligible for such laminar flows.

As mentioned above, the staggered, or alternating, i.e., reverse "mirror image", plate portions 104 of the fluid cooling device 100 improve heat transfer via forced convection and close clearance, laminar, developing flow. For example, heat transfer from the fluid cooling device 100 to the coolant flowing through the fluid cooling device 100 can be improved by increasing the number of staggered plate portions 104 and/or the number of cold plate members 102; by providing the plate portions 104 with the optimum plate length, $L_p$, and the optimum channel width, $w_c$; and, by ensuring that the flow of the coolant is laminar.

It should be understood that heat transfer efficiency of the fluid cooling device 100 also can be improved by selecting a coolant with an optimum Prandtl number, Pr, which is a dimensionless fluid property that is often used in heat transfer analyses. Preferably, the coolant used with the fluid cooling device 100 has a Prandtl number greater than unity; i.e., $Pr \geq 1$. This is because, when a coolant with a high Prandtl number, i.e., $Pr \geq 1$, is used with the fluid cooling device 100, the thermal boundary layer, $\delta_T$, generally develops more slowly than the hydrodynamic or velocity boundary layer, $\delta_V$. As a result, it is generally easier to keep the thin thermal boundary layers, $\delta_T$, near the opposing surfaces of plate portions 112 from merging, thereby improving the heat transfer efficiency from the coolant to the plate portions 104 of the fluid cooling device 100. In instances with relatively high Prandtl numbers, the entry region is sufficiently long to inhibit merging of the developing layers even if the developing flow is turbulent rather than close clearance, laminar. As a result, the present invention can be practiced in the developing turbulent flow regime when using a coolant with a sufficiently high Prandtl number. It should be noted also, however, that the invention still applies when Pr<1.

The preferred method of manufacturing the fluid cooling device of the present invention will now be described with reference to FIGS. 2 and 3. It should be understood that this is merely the preferred manufacturing method, and other manufacturing methods are possible. As mentioned above, the fluid cooling device 100 of the present invention includes a plurality of cold plate members 102. Accordingly, in the preferred method of manufacturing the fluid cooling device 100, each cold plate member 102 is first stamped-out from, e.g., metal sheet stock.

Figure 2:
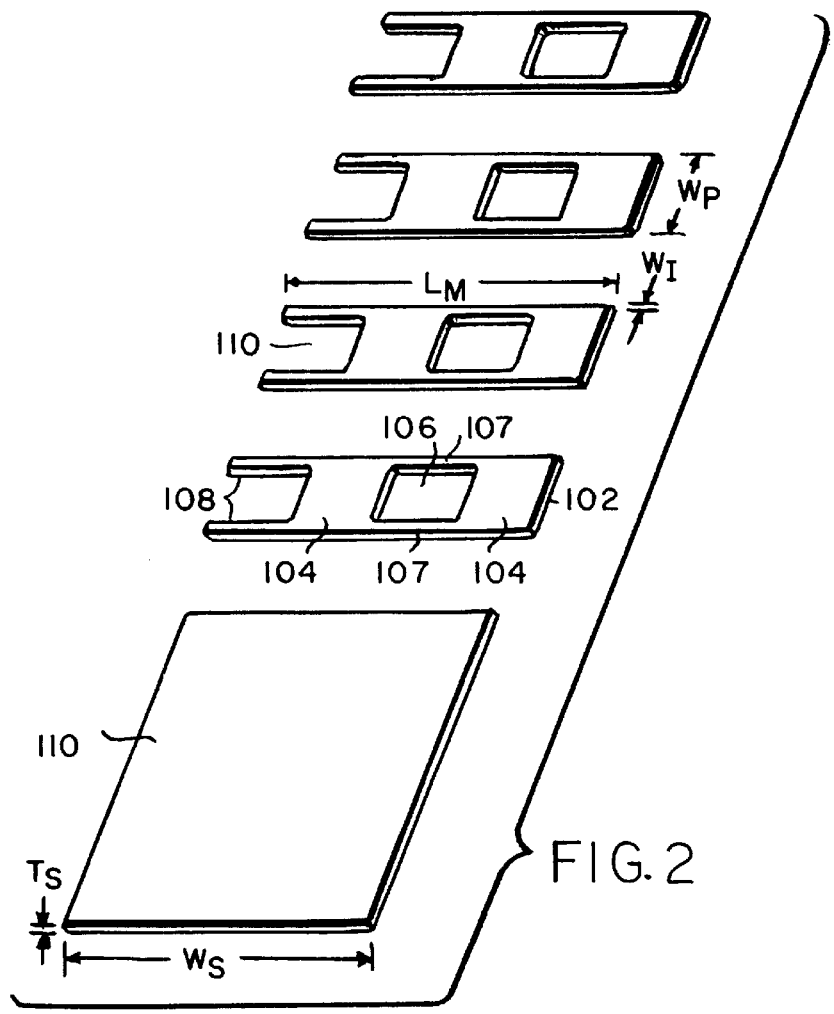
FIG. 2 is a perspective view of an embodiment of a portion of sheet stock, and a plurality of cold plates stamped therefrom.

For example, FIG. 2 shows illustrative embodiments of the cold plate members 102 stamped-out from metal sheet stock 110, e.g., aluminum sheet stock. Preferably, each plate portion 104 has a generally square or rectangular shape. However, it should be understood that other shapes are possible. Furthermore, the plurality of plate portions 104 is arranged in a line between the at least one pair of imperforate strips 107 at regularly spaced intervals, thereby defining the perforate portion 106, which also has a generally square or rectangular shape. In addition, the at least one pair of imperforate strips 107 of each stamped-out cold plate member 102 include respective projecting portions 108 at one end of the cold plate member 102, having a length slightly greater than the width of the perforate portion 106.

Any suitable stock can be used for forming the plurality of cold plate members 102. For example, the raw stock can be any sheet, roll, or layered material such as metal, polymer, ceramic, plastic, resin, or any other suitable material or composite. In one non-limiting representative configuration, the sheet stock is a sheet of aluminum alloy 110 having a thickness, $T_S$, equal to about 0.5 mm, and a width, $W_S$, equal to about 70 mm. Accordingly, the cold plate members 102 stamped out of this illustrative metal sheet stock 110 have a thickness, $T_P$ (see FIG. 5), equal to about 0.5 mm, and a length, $L_M$, equal to about 70 mm.

Further, the imperforate strips 107 have a width, $W_I$, equal to about 1.5 mm; and, each plate portion 104 has a width, $W_P$, equal to about 13 mm (see FIG. 5). Still further, the plate portions 104 of each cold plate member 102 are separated by a distance that is slightly greater than the plate length, $L_P$. Narrow perforations are preferred when the plurality of cold plate members 102 are superimposed. It should be understood, however, that actual materials and dimensions used in forming the plurality of cold plate members 102 varies depending upon, e.g., specific properties of the coolant, specific cost and performance requirements of the target system, and raw stock availability.

As mentioned above, adjacent cold plate members 102a and 102b of the fluid cooling device 100 of the present invention are in intimate contact with each other such that respective projecting portions 108 of the adjacent cold plate members 102a and 102b are at opposing sides of the fluid cooling device 100. Furthermore, the ends of the adjacent cold plate members 102a and 102b are in registration. Thus, adjacent cold plate members 102 are reverse "mirror images" of one another. Accordingly, subsequent steps of the preferred method of manufacturing the fluid cooling device 100 include obtaining a plurality of stamped cold plate members 102; and positioning the cold plate members 102 relative to each other so that each cold plate member 102a is a reverse mirror image of its adjacent cold plate member(s) 102b.

Figure 3:
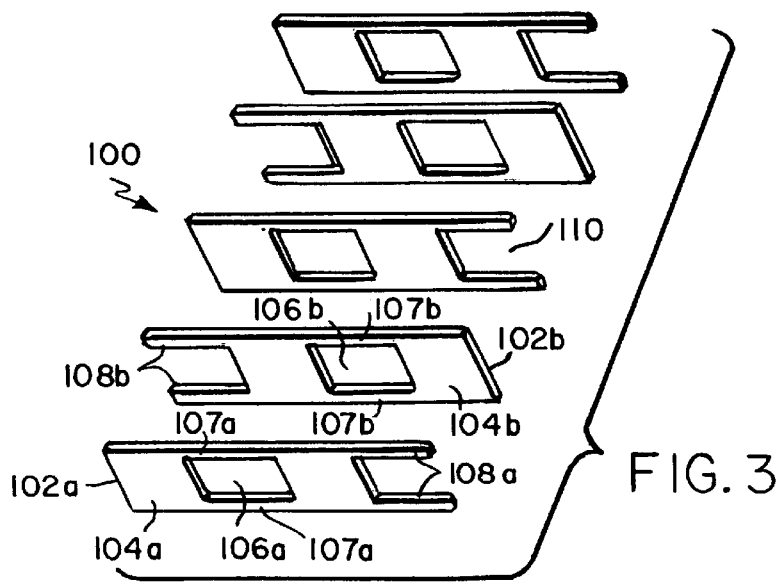
FIG. 3 is a partial exploded, perspective view of an embodiment of the fluid cooling device shown in FIG. 1.

This is depicted in FIG. 3, which shows cold plate members 102 positioned relative to each other so that the cold plate member 102a is a reverse mirror image of the cold plate member 102b, and vice versa. As a result, projecting members 108a and 108b of the cold plate members 102a and 102b, respectively, are at opposing sides of the resulting fluid cooling device 100, but in registration.

Each cold plate member 102a then is disposed and remains in contact with its adjacent cold plate member(s) 102b. As mentioned above, adjacent cold plate members 102 of the fluid cooling device 100 are joined at face portions of respective imperforate strips 107 in any suitable manner. Accordingly, the adjacent cold plate members 102a and 102b, and remaining cold plate members (not numbered) of the fluid cooling device 100, can be joined at face portions (not numbered) of respective imperforate strips 107a and 107b. The specific manner in which the adjacent cold plate members 102 are joined to remain in intimate contact is not critical to the present invention, so long as the resulting fluid cooling device 100 has sufficient structural integrity for the target application. Alternatively, the cold plate members 102a and 102b and the remaining cold plate members of the fluid cooling device 100 can be suitably joined to a common base plate (not shown).

As a result, adjacent cold plate members 102 are superimposed such that a plate portion 104a at one end of each cold plate member 102a is opposite projecting portions 108b of its adjacent cold plate member(s) 102b, and remaining plate portion(s) 104 of each cold plate member 102a are in registration with perforate portion(s) 106b of its adjacent cold plate member(s) 102b. In effect, the plate portions 104a of the adjacent cold plate members 102a and 102b are staggered, i.e., the respective plate portions 104 of the adjacent cold plate members 102a and 102b form an alternating pattern, which provides alternate parallel paths of flow 120 and 122 through the fluid cooling device 100 for a coolant.

Preferred methods of manufacturing fluid cooling devices 100, including the steps of stamping-out a plurality of cold plate members 102 from raw stock, positioning the stamped cold plate members 102 relative to each other so that each cold plate member 102a is a reverse mirror image of its adjacent cold plate member(s) 102b, and joining each positioned cold plate member 102a with its adjacent cold plate member(s) 102b, will produce staggered cold plate portions 104 that can be optimized for close clearance, laminar, developing flow.

For example, this manufacturing method is particularly useful for producing fluid cooling devices 100 wherein the thickness, $T_P$, of each plate portion 104 is equal to the flow channel width, $W_c$. Accordingly, the flow channel width, $W_c$, for achieving the desired close clearance laminar developing flow can be easily obtained by merely selecting sheet stock with an optimal thickness, $T_S$.

Having described one embodiment, numerous alternative embodiments or variations can be made. For example, particular raw stock material and particular dimensions of the cold plate members 102 of the fluid cooling device 100 were described. However, these were merely illustrative examples, and, as mentioned above, other useful materials and/or dimensions can be utilized, depending upon the specific cost and performance requirements of the target system and/or component. It should be noted, however, that the fluid cooling device 100 of the present invention is especially beneficial when configured for providing close clearance, laminar, developing flow, thereby enhancing heat transfer via, e.g., forced convection, from the fluid cooling device 100 to the coolant flowing therethrough. Further, when a coolant with a sufficiently high Prandl number is used, the present invention can be practiced providing turbulent developing flow.

In addition, it was described that each cold plate member 102 of the fluid cooling device 100 can include at least one pair of imperforate strips 107 for connecting the plate portions 104 together, each at opposing ends thereof. However, this was merely an illustrative example, and alternative embodiments of the cold plate members 102 are possible. For example, one alternative embodiment of each cold plate member 102 can include a single imperforate strip 107 for connecting the plate portions 104 together, each at one end thereof.

Figure 7:
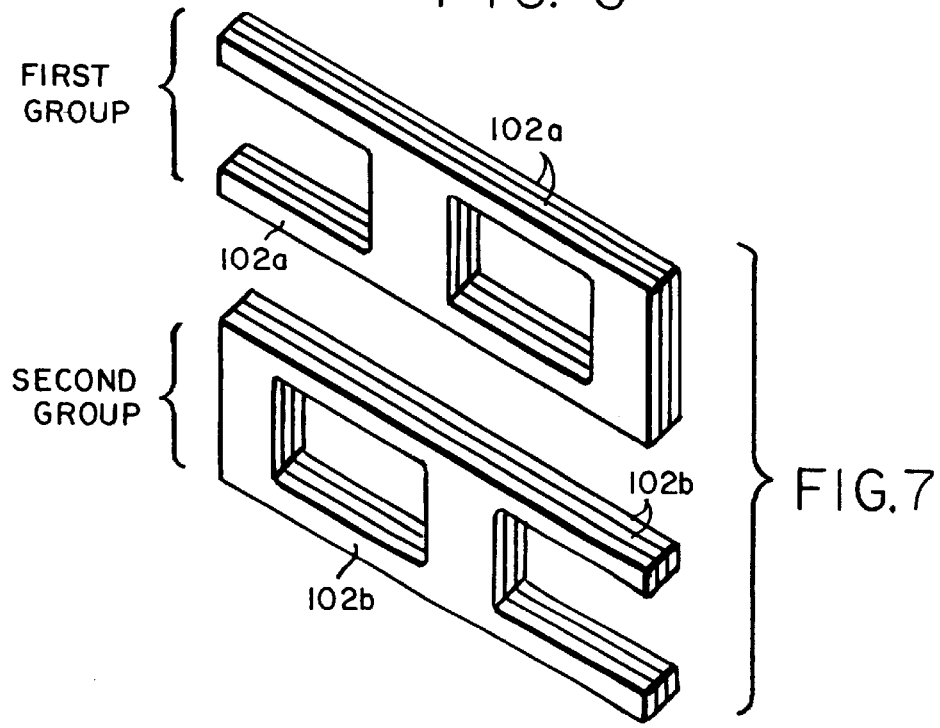
FIG. 7 is a perspective view of an embodiment of a first group and a second group of cold plates.

In addition, it was described that, in the method of manufacturing the fluid cooling device 100 of the present invention, a plurality of cold plate members 102 is positioned relative to each other so that each cold plate member 102a is a reverse mirror image of its adjacent cold plate members 102b, and then each cold plate member 102a is joined with its adjacent cold plate members 102b, thereby forming the fluid cooling device 100. However, this was also merely an illustrative example. Referring to FIG. 7, alternately, a first group of cold plate members 102, comprising a plurality of cold plate members 102, is positioned in the same orientation and joined; and, a second group of cold plate members 102, comprising a plurality of cold plate members 102, is positioned in the same orientation and joined. Then, the first group and the second group are disposed relative to each other so that the first group is a reverse mirror image of the second group and vice versa. These adjacent groups of cold plate members 102 are then be joined together, i.e., stacked, to form a cooling device 100. Thus, an alternative fluid cooling device 100 configuration having the desired flow channel dimension is provided by a plurality of cold plate members 102 that is easily fabricated. Indeed, the thickness of the channels can be easily varied by the size of the groups.

It was described that each cold plate member 102 is stamped-out from raw stock. However, this was merely an illustrative embodiment. The cold plate members 102 alternatively can be formed using other suitable processes such as wire and plunge EDM-ing, laser etching, water abrasion jet cutting, fin folding, fine-bit end milling or the like.

It was described that the fluid cooling device 100 is normally thermally engaged with one or more components of an electronic system, on one or both sides of the fluid cooling device 100, in any conventional manner. However, it should be pointed out that in applications wherein optimal thermal engagement is critically dependent upon surface flatness, the surface of the fluid cooling device 100 that thermally engages the electronic component can be, e.g., end-milled, sanded, ground down or the like to a desired level of flatness. Because the step of end-milling/sanding/grinding a surface is generally relatively low-cost, the addition of this step of manufacturing the fluid cooling device 100 is not expected to substantially increase the overall cost of the fluid cooling device 100.

The present invention has been described in detail including preferred embodiments thereof. However, it should be appreciated that those skilled in the art, upon consideration of the present disclosure, may make modifications and/or improvements on this invention and still be within the scope and spirit of this invention as set forth in the following claims.

What is claimed is:

1. A fluid cooling device comprising:

a plurality of cold plate members, each cold plate member having a thickness and a first length and comprising at least one imperforate plate portion having a surface and a second length in a direction of fluid flow, at least one perforate portion having a width and a third length in the direction of fluid flow, and a pair of imperforate connector portions, wherein the second length of the plate portion of each cold plate member, $L_p$, is less than an entrance length, $L_e$, where $L_e$ is a distance from an entrance of a channel to a point at which fluid flowing along a boundary flow layer of each face of opposing surfaces of the near adjacent plate portions, which define the channel, merges resulting in exchange of fluid between the boundary flow layers and, further, wherein the plurality of cold plate members is aggregated to form a stack with at least one of the plurality of imperforate connector portions of each cold plate member in contact with at least one of the plurality of imperforate connector portions of an adjacent cold plate member, and a plate portion of each cold plate member is positioned in registration with a perforate portion of an adjacent cold plate member in the stack, and, further, wherein each cold plate member is a reverse mirror image of all cold plate members adjacent thereto, and whereby a fluid coolant flows along a plurality of opposing surfaces of near adjacent plate portions in substantially continuous laminar flow.

2. The fluid cooling device as recited in claim 1, wherein the second length of the plate portion, $L_p$, of each cold plate member is less than the third length of the perforate portion.

3. The fluid cooling device as recited in claim 1, wherein the shape of the perforate portion is substantially rectangular.

4. The fluid cooling device as recited in claim 1, wherein the shape of the plate portion is substantially rectangular.

5. The fluid cooling device as recited in claim 1, wherein the pair of imperforate connector portions comprises a pair of projecting portions at a first end of the cold plate member, each of the pair of projecting portions having a length approximately equal to the width of the perforate portion.

6. The fluid cooling device as recited in claim 5, wherein respective positions of the connector projecting portions of adjacent cold plate members in the stack alternate between opposing ends of the fluid cooling device.

7. The fluid cooling device as recited in claim 1,
wherein the plurality of cold plate members is joined to form a stack in a plurality of groups, plate portions of each cold plate member in each group being in registration with the plate portions of adjacent cold plate members in the group, and
wherein the plurality of groups of cold plate members is joined to form a stack, thereby causing plate portions of each cold plate member in each group to be in registration with the perforate portions of adjacent groups in the stack.

8. The fluid cooling device as recited in claim 1, wherein the substantially continuous laminar flow is developing flow.

9. The fluid cooling device as recited in claim 8, wherein the developing fluid flow is close clearance, laminar developing flow.

10. The fluid cooling device as recited in claim 9, wherein the close clearance laminar developing flow has a Reynolds number less than its critical Reynolds number, $Re_{cr}$.

11. The fluid cooling device as recited in claim 10, wherein the close clearance laminar developing flow has a Reynolds number less than about 10,000.

12. The fluid cooling device as recited in claim 10, wherein the close clearance laminar developing flow has a Reynolds number less than about 5000.

13. A method of manufacturing the fluid cooling device of claim 1, comprising the steps of:
forming a plurality of cold plate members, wherein each cold plate member includes a plurality of imperforate plate portions, at least one perforate portion, and at least one connector portion, having a pair of opposing face portions, for connecting plate portions together;
positioning the plurality of cold plate members relative to each other so that a plate portion of each cold plate member is in registration with a perforate portion or a pair of projecting portions formed in adjacent cold plate members,
wherein each cold plate member of said plurality of cold plate members is positioned relative to adjacent cold plate members of said plurality of cold plate members so that they are reverse mirror images of each other; and
joining each cold plate member with its adjacent cold plate members, thereby forming the fluid cooling device.

14. The method of manufacturing the fluid cooling device of claim 13, wherein the plurality of cold plate members is joined at opposing face portions of the at least one connector portion.

15. The method of manufacturing the fluid cooling device of claim 14, wherein the plurality of cold plate members is joined using a method selected from the group consisting of gluing, soldering, brazing, pinning, epoxying, crimping, swaging, and riveting.

16. The method of manufacturing the fluid cooling device of claim 13, wherein the plurality of cold plate members is joined to at least one common base plate.

17. The method of manufacturing the fluid cooling device of claim 16, wherein the plurality of cold plate members is joined to at least one common base plate using a method selected from the group consisting of gluing, soldering, brazing, pinning, epoxying, crimping, swaging, and riveting.

18. The method of manufacturing the fluid cooling device of claim 13 further including the step of smoothing one or more surfaces of the fluid cooling device that are thermally engaged to a heat producing device.

19. The method of manufacturing the fluid cooling device of claim 18, wherein the one or more surfaces of the fluid cooling device that are thermally engaged to a heat producing device are optimally smoothed using a method selected from the group consisting of end-milling, sanding, and grinding.

20. The method of manufacturing the fluid cooling device of claim 13, wherein the plurality of cold plate members is formed using a method selected from the group consisting of stamping, water abrasion cutting, wire and plunge EDM-ing, laser etching, fin folding, fine-bit end milling, extruding, and cutting or slicing.

21. The method of manufacturing the fluid cooling device of claim 13, wherein the positioning step comprises the substeps of (i) positioning a first plurality of cold plate members in a first group so that plate portions of each cold plate member in each group are in registration with the plate portions of adjacent cold plate members in the group; (ii) positioning a second plurality of cold plate members in a second group so that plate portions of each cold plate member in each group are in registration with the plate portions of adjacent cold plate members in the group, and (iii) positioning the first group and the second group of cold plate members relative to each other so that plate portions of each cold plate member in each group are in registration with perforate portions formed in groups adjacent thereto, thereby causing adjacent groups of cold plate members to be reverse mirror images of each other.

22. The method of manufacturing the fluid cooling device of claim 21, wherein the first and second plurality of cold plate members each comprise a plurality of identical cold plate members.

23. A fluid cooling device comprising:
a plurality of cold plate members, each cold plate member having a thickness, a first length, a first end, and a second end, wherein the first end is diametrically opposed to the second end, and comprising at least one imperforate plate portion having a surface and a second length in a direction of fluid flow, at least one perforate portion having a width and a third length in the direction of fluid flow, and a plurality of imperforate connector portions,
wherein the second length of the plate portion of each cold plate member, $L_p$, is less than an entrance length, $L_e$, where $L_e$ is a distance from an entrance of a channel to a point at which fluid flowing along a boundary flow layer of each face of opposing surfaces of the near adjacent plate portions, which define the channel, merges resulting in exchange of fluid between the boundary flow layers and, further,
wherein the plurality of cold plate members is aggregated to form a stack with at least one of the plurality of imperforate connector portions of each cold plate member in contact with at least one of the plurality of imperforate connector portions of an adjacent cold plate member, and a plate portion of each cold plate member is positioned in registration with a perforate portion of an adjacent cold plate member in the stack, and, further, wherein cold plate members are oriented such that the first and second ends of cold plate member are reversed in a longitudinal direction with respect to each adjacent cold plate member, and whereby a fluid coolant flows along a plurality of opposing surfaces of near adjacent plate portions in substantially continuous laminar flow.

24. A method of manufacturing the fluid cooling device of claim 1, comprising the steps of:

forming a plurality of cold plate members, wherein each in the longitudinal direction, wherein the first end is diametrically opposed to the second end, a plurality of imperforate plate portions, at least one perforate portion, and at least one connector portion, having a pair of opposing face portions, for connecting plate portions together;

positioning the plurality of cold plate members relative to each other so that a plate portion of each cold plate member is in registration with a perforate portion or a pair of projecting portions formed in adjacent cold plate members, wherein each cold plate member of said plurality of cold plate members is positioned relative to each adjacent cold plate members of said plurality of cold plate members so that the first and second ends of each cold plate member are reversed in a longitudinal direction with respect to each cold plate member adjacent thereto; and joining each cold plate member with its adjacent cold plate members, thereby forming the fluid cooling device.

* * * * *